United States Patent
Lin

(10) Patent No.: US 9,563,553 B2
(45) Date of Patent: Feb. 7, 2017

(54) DATA STORING METHOD AND EMBEDDED SYSTEM

(71) Applicant: Wistron Corporation, New Taipei (TW)

(72) Inventor: Shu-Yi Lin, New Taipei (TW)

(73) Assignee: Wistron Corporation, New Taipei (TW)

( * ) Notice: Subject to any disclaimer, the term of this patent is extended or adjusted under 35 U.S.C. 154(b) by 37 days.

(21) Appl. No.: 14/681,095

(22) Filed: Apr. 8, 2015

(65) Prior Publication Data

US 2016/0217068 A1    Jul. 28, 2016

(30) Foreign Application Priority Data

Jan. 27, 2015    (TW) .............................. 104102675 A

(51) Int. Cl.
G06F 11/10    (2006.01)
G06F 12/02    (2006.01)
G11C 29/04    (2006.01)

(52) U.S. Cl.
CPC ....... *G06F 12/0246* (2013.01); *G06F 11/1072* (2013.01); *G06F 2212/7201* (2013.01); *G06F 2212/7209* (2013.01); *G11C 2029/0411* (2013.01)

(58) Field of Classification Search
CPC ................................................ G06F 11/1076
USPC ................. 714/773, 774, 776, 764
See application file for complete search history.

(56) References Cited

U.S. PATENT DOCUMENTS

| | | | |
|---|---|---|---|
| 8,559,237 B2 | 10/2013 | Kim | |
| 8,694,869 B2 * | 4/2014 | Grilli | H03M 13/2707 714/774 |
| 9,009,565 B1 * | 4/2015 | Northcott | G11C 29/42 365/185.09 |
| 9,009,568 B2 * | 4/2015 | Luo | G11C 29/12005 714/764 |
| 9,020,047 B2 * | 4/2015 | Hashimoto | H04N 19/176 375/240.25 |
| 9,384,127 B2 * | 7/2016 | Estakhri | G06F 12/0246 |
| 2006/0271725 A1 | 11/2006 | Wong | |

OTHER PUBLICATIONS

"Office Action of Taiwan Counterpart Application" with partial English translation, issued on May 20, 2016, p. 1-p. 8, in which the listed reference was cited.

* cited by examiner

*Primary Examiner* — Fritz Alphonse
(74) *Attorney, Agent, or Firm* — Jianq Chyun IP Office

(57) ABSTRACT

A method for writing update data into a flash memory module to replace original data is provided. The flash memory module includes at least one block including a plurality of sectors. Each of the sectors records a flag. The data storing method includes: getting a first sector, wherein all the bits of the flag of the first sector are the second storage status; writing the update data into the first sector, and programming at least one bit as the first storage status and at least one bit as the second storage status in the flag of the first sector; identifying a second sector storing original data, wherein at least one bit of the flag of the second sector is first storage status and at least one other bit is second storage status; programming all the bits of the second sector as the first storage status.

12 Claims, 4 Drawing Sheets

100

DATA STORING METHOD AND EMBEDDED SYSTEM

CROSS-REFERENCE TO RELATED APPLICATION

This application claims the priority benefit of Taiwan application serial no. 104102675, filed on Jan. 27, 2015. The entirety of the above-mentioned patent application is hereby incorporated by reference herein and made a part of this specification.

BACKGROUND OF THE DISCLOSURE

Field of the Disclosure

The disclosure is related to a data storing method and an embedded system, and more particularly to a data storing method and an embedded system having high write counts.

Description of Related Art

Generally speaking, a conventional embedded system uses an electrically erasable programmable read only memory (EEPROM) as a storage medium for storing small data, which has an advantage of writing and erasing in unit of bytes and allows for a lot of ease when writing multiple units of small data. However, as the capacity of flash memory increases with lower price, the EEPROM in an embedded system becomes relatively expensive and is gradually replaced by the flash memory which is less expensive.

However, unlike EEPROM which performs erase operation in unit of bytes, the flash memory always has to erase a whole block when executing an erase instruction. When a file with smaller data, e.g. a bootloader of a system or configuration of network setting is stored in a block of the flash memory, as the file is updated, the system needs to clear the whole block where the file is stored and then stores the updated file in the original block, which makes the flash memory to have far less re-write counts compared to the EEPROM.

SUMMARY OF THE DISCLOSURE

The disclosure provides a data storing method and an embedded system which may effectively prolong the service life of a flash memory.

According to an exemplary embodiment of the disclosure, a data storing method for writing an update data into a flash memory module to update the original data is provided. The flash memory module at least includes a block which includes a plurality of sectors. Each of the sectors includes a plurality of bits. Each bit may be identified as a first storage status or a second storage status. Each of the sectors records a flag. The data storing method includes getting a first sector of the sectors, wherein all the bits of the flag of the first sector are the second storage status. The data storing method further includes writing the update data into the first sector and programming at least one bit of the flag of the first sector as the first storage status, and programming at least one bit of the flag of the first sector as the second storage status. The data storing method further includes identifying a second sector storing the original data among the sectors, wherein at least one bit of the flag of the second sector is the first storage status, and at least one other bit of the flag of the second sector is the second storage status. The data storing method further includes programming all the bits of the second sector as the first storage status.

In an exemplary embodiment of the disclosure, the data storing method further includes programming all the bits of the block as the second storage status if the block does not have the flag in which all the bits are the second storage status.

In an exemplary embodiment of the disclosure, the data storing method further includes generating a corresponding error correction code for the update data of the first sector.

In an exemplary embodiment of the disclosure, if all the bits of the update data stored in the first sector are the first storage status, all the bits of the corresponding error correction code are the first storage status.

In an exemplary embodiment of the disclosure, the data storing method further includes determining the sizes of the sectors according to the sizes of the update data and original data.

In an exemplary embodiment of the disclosure, the first storage status is 0 and the second storage status is 1.

According to an exemplary embodiment of the disclosure, an embedded system, which includes a flash memory module and a controller, is provided. The flash memory module stores original data and at least includes a block. The block includes a plurality of sectors. Each of the sectors includes a plurality of bits. Each bit may be identified as the first storage status or the second storage status. Each of the sectors records a flag. The controller is coupled to a flash memory module. The controller gets a first sector of the sectors, wherein all the bits of the flag of the first sector are the second storage status. The controller writes the update data into the first sector, programs at least one bit of the flag of the first sector as the first storage status and programs at least one bit of the flag of the first sector as the second storage status. The controller identifies the second sector that stores the original data among the sectors, wherein at least one bit of the flag of the second sector is the first storage status and at least one other bit of the flag of the second sector is the second storage status. The controller programs all the bits of the second sector as the first storage status.

In an exemplary embodiment of the disclosure, if the block does not have the flag in which all the bits are the second storage status, the controller programs all the bits of the block as the second storage status.

In an exemplary embodiment of the disclosure, the controller further generates a corresponding error correction code for the update data stored in the first sector.

In an exemplary embodiment of the disclosure, if all the bits of the update data stored in the first sector are the first storage status, all the bits of the corresponding error correction code are the first storage status.

In an exemplary embodiment of the disclosure, the controller determines the sizes of the sectors according to the sizes of the update data and the original data.

In an exemplary embodiment of the disclosure, the first storage status is 0 and the second storage status is 1.

As indicated above, in the disclosure, the data writing method and the embedded system may search for the sector that is not written with data according to the flag and write the update data thereto, and set all the bits of the sector that stores the original data as the first storage status. Accordingly, every time when the data is updated, the sectors in the block may be used one by one for the update data to be written in. Only when all the sectors have been used, i.e. the block no longer has any sectors remained unwritten with data, the whole block is erased, thereby prolonging the service life of the flash memory.

In order to make the aforementioned features and advantages of the disclosure more comprehensible, embodiments accompanying figures are described in detail below.

DESCRIPTION OF EMBODIMENTS

In order to make the embodiments of the disclosure more comprehensible, an NAND flash memory having a capacity of 256 MB is used as an example below for description. The flash memory may include 2048 blocks, and each block may include 64 pages; therefore, the size of each block is 128 KB, and the size of each page is 2 KB.

The flash memory stores an error correction code (ECC) in an out of band (OOB) region of each page and uses the ECC to correct data error. In addition, each page may be divided into four chunks in a size of 512 bytes. The ECC is calculated in unit of chunks. Accordingly, every time when a chunk of data is corrected, the system calculates the corresponding ECC (16 bytes in size) of the chunk and stores ECC in the OOB region of the page of the chunk. Since one page in a size of 2 KB includes four chunks, each page in a size of 2 KB includes 64 bytes of OOB region. Therefore, the actual size of one page may be (2K+64) bytes, i.e. the data region pluses an OOB region. The actual size of each block may be 64×(2K+64) bytes=(128K+4K) bytes. It should be pointed out that the OOB region is used by the system to access the ECC corresponding to the page; therefore, the OOB region is not accessible by the user. Moreover, when data is written, the smallest unit for writing data into the flash memory is one byte. When data is erased, the smallest unit for erasing data from the flash memory is one block.

The above descriptions related to the block, page and chunk of the flash memory and the amount and size of OOB are incorporated here only for the purpose of making the exemplary embodiments of the disclosure to be more comprehensible. Therefore, it should be understood that the disclosure is not limited thereto the above descriptions. In the disclosure, the block, page and chunk of the flash memory and the amount and size of and OOB may be arranged differently. The flash memory may also be an NOR flash memory or other types of flash memory.

Figure 1:
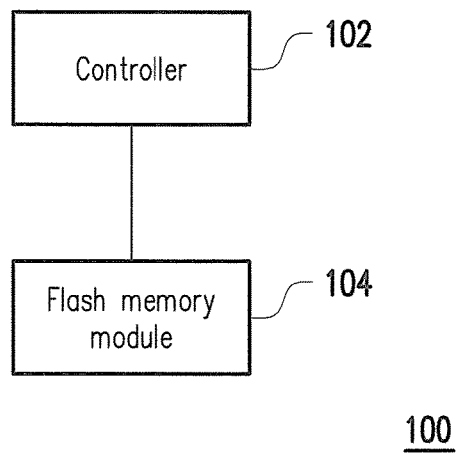
FIG. 1 is a block view illustrating an embedded system according to an exemplary embodiment of the disclosure.
Figure 2A:
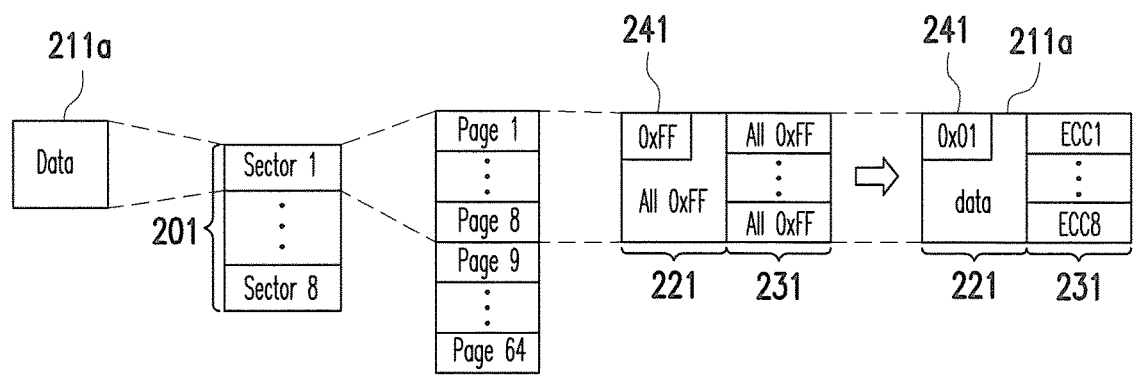
FIGS. 2A-2C are schematic views illustrating accessing a sector of a flash memory module according to an exemplary embodiment of the disclosure.
Figure 2B:
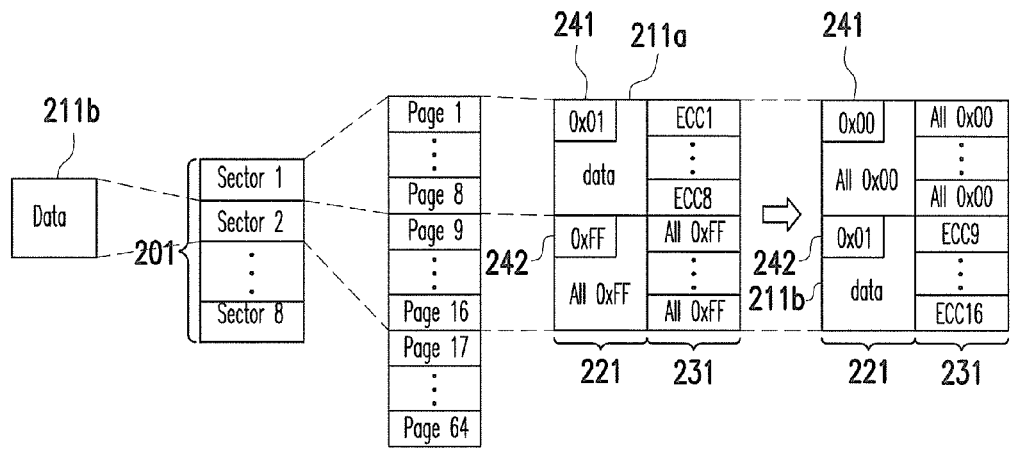
Figure 2C:
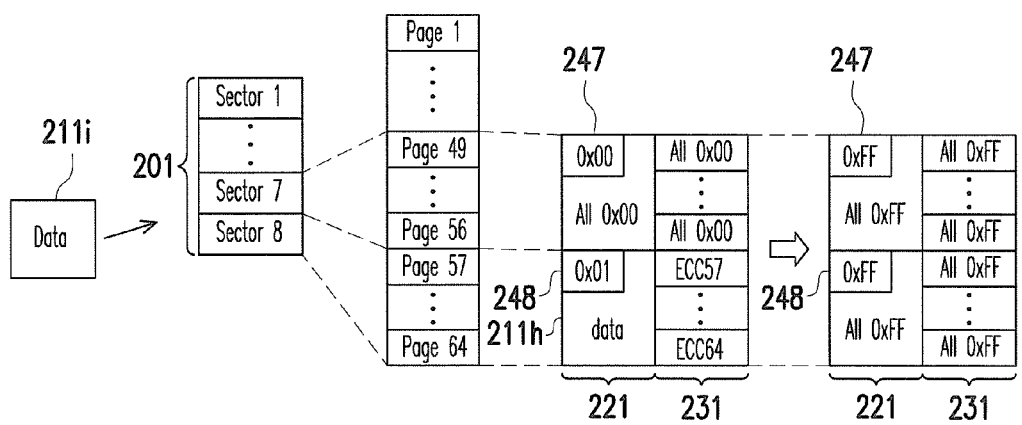

FIG. 1 is a block view illustrating an embedded system according to an exemplary embodiment of the disclosure, and FIGS. 2A-2C are schematic views illustrating accessing a sector of a flash memory module according to an exemplary embodiment of the disclosure.

Referring to FIGS. 1 and 2A, in the exemplary embodiment of the disclosure, an embedded system 100 includes a controller 102 and a flash memory module 104, wherein the controller 102 is coupled to a flash memory module 104 and configured to perform write operation to write data into the flash memory module 104 or perform read operation to read data from the flash memory module 104.

In a case where 16 KB of data 211a is to be stored in a block 201 of the flash memory module 104, the controller 102 identifies the size of the data 211a first. That is to say, the controller 102 determines that the data 211a may be stored in eight pages, wherein the size of each of the pages is 2 KB. Therefore, the controller 102 divides page 1 to page 64 of the block 201 into eight sectors, wherein the sector 1 corresponds to page 1~page 8 and sector 2 corresponds to page 9~page 16 and so forth. Here, the data may be a bootloader of the embedded system 100, configuration of network setting (e.g. IP address, network mask, a gateway address) or a system profile of the embedded system 100 and the like.

Here, it is assumed that the block 201 has not been written with data, and therefore the byte of all pages is recorded as 0xFF. Here, the controller 102 identifies the first bytes of sector 1 (i.e. the first bytes of page 1) as a flag 241. Since the byte of all pages in the block 201 is 0xFF, the flag 241 is also 0xFF as well. In the exemplary embodiment, when the flag value of flag 241 is 0xFF, it represents that the sector 1 of the corresponding flag is a sector that has not been written with data. Likewise, the flags of sector 2~sector 8, namely the first bytes of sector 2~sector 8 are also 0xFF at this time. Although it is described above that the first byte of each sector is used as the flag, the disclosure is not limited thereto. In another exemplary embodiment, any one of bytes in the sector may be used as the flag, or any plurality of bytes in the sector may be used as the flag.

Before the controller 102 writes the data 211a into the block 201, the controller 102 searches for the sector that has not been written according to the flag of all sectors in the block 201. In other words, the controller 102 looks for the flag with the flag value of 0xFF from flag 241~flag 248 and writes the data 211a into the sector corresponding to the flag. At this time, since the flag values of flag 241~flag 248 are 0xFF, the controller 102 chooses a first sector 1 (or first sector) to be written with the data 211a.

When the controller 102 writes the data 211a into the sector 1, the controller 102 modifies the flag 241 of the sector 1, namely the first bytes (or the first bytes of page 1) of the sector 1 to be 0x01 to show that currently the sector 1 stores valid data. At this time, the data 211a is stored in a data region 211 of page 1~page 8. Although it is described above that the flag value of the flag 241 is modified as 0x01 to show that the corresponding sector stores valid data, the disclosure is not limited thereto. The flag value of the 241 may also be modified as other values that are neither 0x00 nor 0xFF such as 0x02, 0x03 . . . 0xFE and the like to show that the corresponding sector stores valid data.

It should be mentioned that, when the data 211a is written into the data region 211 of page 1~page 8, the controller 102 calculates ECC1~ECC8 from page 1~page 8 respectively and writes ECC1~ECC8 into an OOB region 231 corresponding to page 1~page 8 respectively. Here, ECC1~ECC8 may be generated by using error-correct-algorithm such as BCH, RS or humming code. It should be noted that, in a block that has completely not been written with data, the ECC value corresponding to all the pages thereof is 0xFF.

Referring to FIG. 2B, the data 211b may be an update file of the data 211a or other types of file. Before the controller 102 writes the data 211*b* into the block 201, the controller 102 searches for the sector that has not been written with data according to the flag of all sectors in the block 201. In other words, the controller 102 looks for the flag with the value of 0xFF from the flag 241~flag 248 and writes the data 211*a* into the sector corresponding to the flag. At this time, since the flag value of the flag 241 is 0x01, the values of flag 242~flag 248 are 0xFF as well. Therefore, the controller 102 chooses the sector 2 (i.e., the first sector) among sector 2~sector 8 to be written with the data 211*b*.

When the controller 102 writes the data 211*b* into the sector 2, the controller 102 modifies the flag value of flag 242 in the sector 2, namely the first byte of the sector 2 (or the first byte of page 9), to be 0x01 to show that currently the sector 2 stores valid data. At this time, the data 211*b* is stored in the data region 211 of page 9~page 16.

Likewise, when the data 211*b* is written into the data region 211 of page 9 page 16, the controller 102 calculates ECC9~ECC16 of page 9~page 16 respectively and writes the ECC9~ECC16 into the OOB region 231 corresponding to page 9~page 16 respectively.

Apart from writing ECC9~ECC16 into the OOB region 231 corresponding to page 9~page 16 respectively, since the data 211*a* in the sector preceding the sector 2, namely the sector 1, is no longer valid data, the controller 102 further modify all the bytes in the data region 221 of the sector 1 (or second sector) as 0x00; in the meantime, the flag value of the flag 241 of sector 1 is modified as 0x00, it represents that the sector 1 has been written with data and currently does not have any valid data.

When the controller 102 modifies all the bytes in the data region 221 of sector 1 (or second sector) as 0x00, the controller 102 calculates ECC 1~ECC8 of page 1~page 8 respectively. Since the byte of all the data is 0x00, the byte of all the generated ECC is also 0x00. The controller 102 writes all the bytes of the OOB 231 of page 1~page 8 as 0x00.

Referring to FIG. 2C, when the data is written for several times using the method described by FIGS. 2A and 2B and the sector 8 in the block 201 has data, all the bytes in the data region 221 of sector 1~sector 7 are modified as 0x00. Moreover, the flag value of flag 241~flag 247 of sector 1~sector 7 is also modified as 0x00. At this time, if the controller 102 is to write data 211*i* into the block 201, the controller 102 checks the flag 241~flag 248 of sector 1~sector 8 in the block 201 first. Since the flag value of flag 241~flag 247 is 0x00 and the flag value of the flag 248 is 0x01, the controller 102 does not find the sector with flag value of 0xFF, which represents that the block 201 no longer has any sector that has not been written with data. At this time, the controller 102 has to erase the whole block 201, that is, erase all the bytes of sector 1~sector 8 as 0xFF. Next, by using the same method as described by FIG. 2A, the data 211*i* may be written into the sector 1, namely the data region 211 of page 1~page 8.

In the disclosure, the whole block 201 is erased only when all the sectors in the block 201 have performed write operation, that is, the block 201 is erased only when the eight sectors in the block 201 have stored data. Unlike conventional flash memories in which the whole block is erased when one sector is updated, under equivalent frequency of updating data in sector, the frequency of erasing the block 201 by using the write method of the disclosure is only one-eighth compared to the erasing frequency in the conventional flash memories. Accordingly, the write count of data by the flash memory may increases to eight times compared to the conventional flash memories, thereby prolonging the service life of the flash memory.

It should be mentioned that the controller 102 in the exemplary embodiment may be a logic operation circuit so as to perform operation such as distributing sectors, searching for sectors that have not been written with data and setting the flag of sectors when the data is written; however, the disclosure is not limited thereto. In another embodiment, the above functions performed by the controller 102 may also be implemented using program codes of firmware or software. When the embedded system 100 is powered on, the program codes is loaded into the memory and executed by a micro controller unit (MCU) to complete the functions executed by the controller 102.

Figure 3:
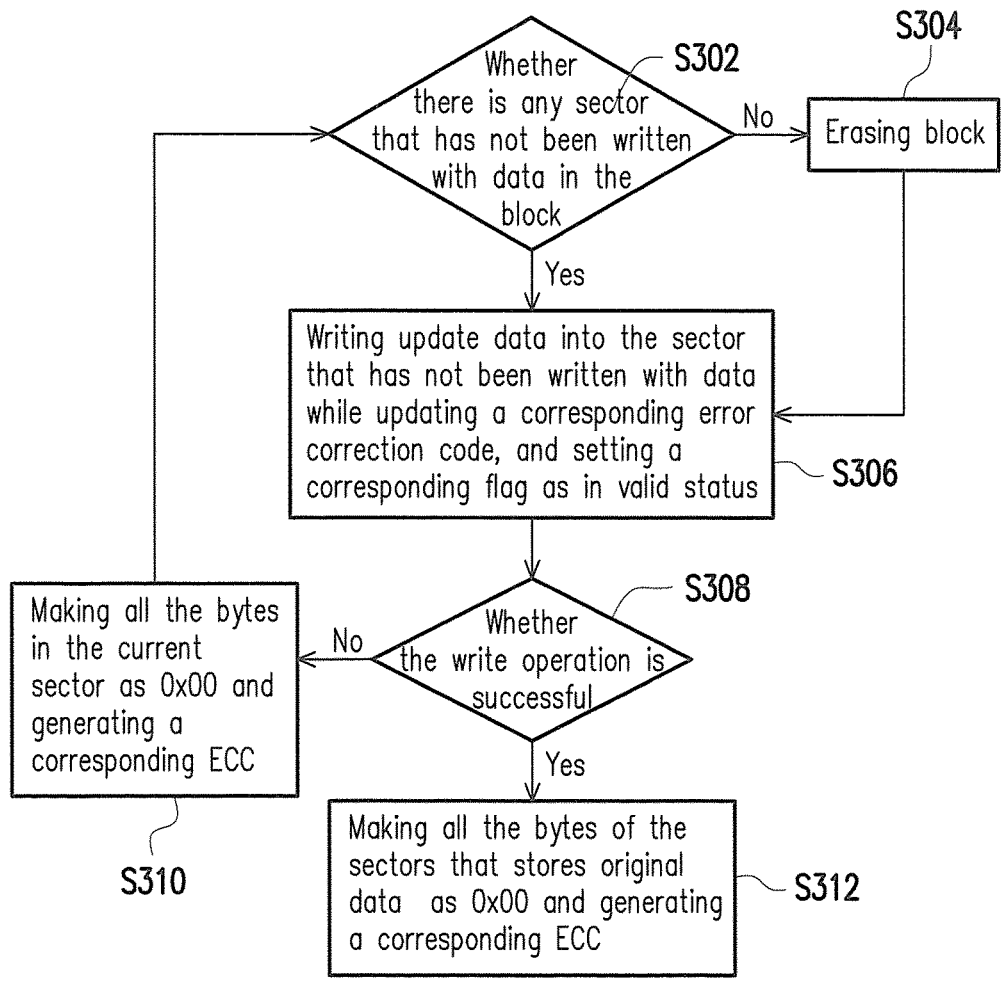
FIG. 3 is a flow chart illustrating a data storing method illustrated according to an exemplary embodiment of the disclosure.

FIG. 3 is a flow chart illustrating a data storing method illustrated according to an exemplary embodiment of the disclosure.

In step S302, the controller 102 sequentially checks the flag of each sector in the block to look for the unwritten sector having flag value of 0xFF, namely the sector that has not been written with data after the block is erased.

If the block does not have any unwritten sector having the flag value of 0xFF, in step S304, the controller 102 erases the block to modify all the bytes in the block as 0xFF.

If the block has an unwritten sector having the flag value of 0xFF, in step S306, the controller 102 writes update data into the unwritten sector having the flag value of 0xFF and sets the corresponding flag to be in a valid status, e.g. 0x01. In the meantime, when the update data is written into the sector, the controller 102 updates the ECC corresponding to the page.

In step S308, the controller 102 determines whether the write operation is successful.

If the write operation is not successful, in step S310, the controller 102 makes all the bytes in the current sector as 0x00 and generates a corresponding ECC (wherein all the bytes of ECC are 0x00 as well). Then, step S302 is executed to look for the unwritten sector to be written with data again.

If the write operation is successful, in step S312, the controller 102 makes all the bytes of the sectors that stores original data (i.e. old data) as 0x00 (including the flag of the sectors) and generates a corresponding ECC (wherein all the bytes of ECC are 0x00 as well). In that case, the controller 102 may determine that all the data previously stored in the sector is no longer valid according to the flag value 0x00.

Figure 4:
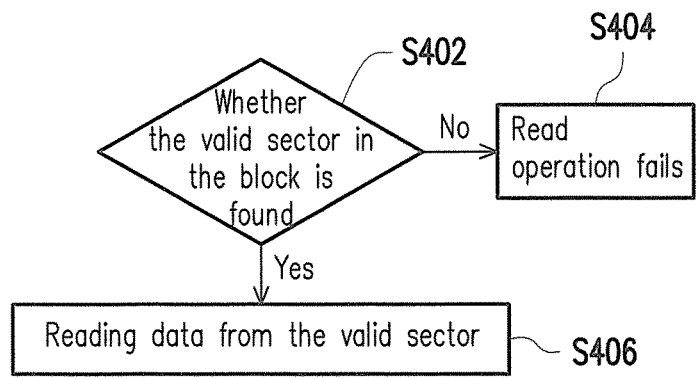
FIG. 4 is a flow chart illustrating data reading illustrated according to an exemplary embodiment of the disclosure.

FIG. 4 is a flow chart illustrating data reading illustrated according to an exemplary embodiment of the disclosure.

In step S402, when the controller 102 is to read data, the controller 102 searches for a valid sector in the block, namely the sector having a flag value that is neither 0x00 nor 0xFF. If the block does not have any valid sector, in step S404, the controller 102 sends a message indicating reading failure.

If the block has a valid sector, in step S406, the controller 102 reads data from the data region of the valid sector, for example, reads the bootloader of the embedded system 100, the configuration of network setting (e.g. IP address, network mask, gateway address), the system profile of the embedded system 100 and the like.

Figures 5, 6:
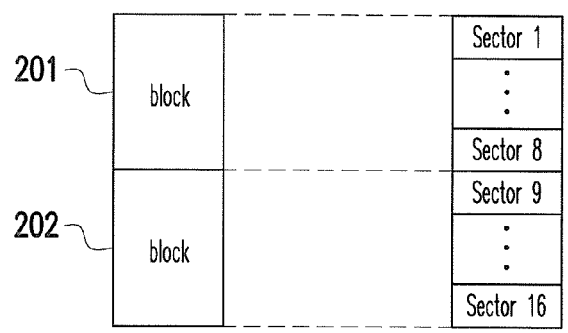
FIG. 5 is a schematic view illustrating accessing a sector of a flash memory module according to another exemplary embodiment of the disclosure.
FIG. 6 is a schematic view illustrating accessing a sector of a flash memory module according to another exemplary embodiment of the disclosure.

FIG. 5 is a schematic view illustrating accessing a sector of a flash memory module according to another exemplary embodiment of the disclosure.

Referring to FIG. 5, in comparisons to FIGS. 2A-2C in which a single block 201 is used for storing data, FIG. 5 shows that two blocks, namely block 201 and block 202, may be used for storing the data.

Same as the first step shown by FIG. 2A, when there is no data stored in the block 201 and 202, all the bytes in the data region and OOB region of sector 1~sector 16 are 0xFF. Certainly, the flag value of all the sectors is 0xFF, which represents that all the sectors are currently not written with data. Before the first data is to be written, the controller 102 finds out the unwritten sector 1 according to the flags of sector 1~sector 16, writes the data into the sector 1 and modifies the flag of sector 1 as 0x01, representing that the sector 1 currently stores valid data. When the data is written into the sector 1, the controller 102 calculates the ECC in each page of the sector 1 and stores the ECC in the OOB region of the sector 1; such operation is the same as described in the second step illustrated by FIG. 2A.

When update data is to be written in, the controller 102 writes the data into the sector 2 and re-programs the data region and OOB region of the sector 1. In other words, all the bytes in the data region and the OOB region of the sector 1 is re-programmed as 0x00.

Likewise, each update data is written into the sector 3~the sector 16 in sequence, and the controller 102 re-programs the data region and the OOB region of the sector 2~the sector 15 respectively. Thereafter, when the next update data is to be written and flag value of the sector (i.e. sector 1) following the sector 16 with flag value of 0x01 is 0x00, the controller 102 erases the block 201 to set all the bytes in the block 201 as 0xFF. Similarly, when the flag value of the sector 8 is 0x01 and the flag value of the other sectors is 0x00, the controller 102 erases the block 202 to set all the bytes in the block 202 as 0xFF.

In another exemplary embodiment, the controller 102 may check all the flag values of the block after each data has been written in. If all the flag values of one block are 0x00, the block is erased. That is to say, after the update data has been written into the sector 9, the controller 102 may identify all the flag values of the block 201 as 0x00 and erase the block 201.

Although it is described above that two blocks are used for storing data, the disclosure is not limited thereto. In the disclosure, three or more blocks may be used for storing the data to prevent generation of bad blocks during operation or to meet the need for larger data storage capacity.

FIG. 6 is a schematic view illustrating accessing a sector of a flash memory module according to another exemplary embodiment of the disclosure.

Referring to FIG. 6, different from the above exemplary embodiments in which the size of the sectors is multiple times larger than the size of the pages, however, the size of the sectors may also be set to be a quarter of the size of one page (2 KB), namely the size of one chunk (512 bytes).

Same as the above exemplary embodiments, when the first data is to be written, the controller 102 looks for the sector 1 which has not been written with data to write the data into the sector 1 and modified the flag value of the sector 1 as 0x01, showing that the sector 1 currently stores valid data. When the data is written into the sector 1, the controller 102 also calculates ECC1 of the sector 1 and stores ECC1 in the OOB region of the sector 1. Since the size of the current sector 1 is equivalent to the size of a chunk, the size of ECC1 is a quarter of the size of the ECC of one page (64 bytes), namely 16 bytes.

Next, the operation shown by FIG. 5 may be repeated until a sector 256 stores the valid data, that is, the flag value of the sector 256 is 0x01. At this point, all the bytes of the sector 1~the sector 255 are 0x00. If new data is to be written in, the controller 102 erases the block 201 for the new data to be written into the sector 1.

In the flash memory of the disclosure, the size of one chunk is 512 bytes and the chunk is the minimum unit for executing ECC calculation. Therefore, the size of the sectors is calculated in unit of 512 bytes which is the size of one chunk. Although it is described above that the chunk is used for describing the size of the sector, the disclosure is not limited thereto. The disclosure may also use two or more chunks for describing the size of the sectors.

In summary, the exemplary embodiments provide the data storing method which divides the block of the flash memory into a plurality of sectors. Each sector has a flag. When the flag value is 0xFF, it represents that the sector has not been written with data. When the flag value is 0x00, it represents that the sector is in a blank status. When the flag value is neither 0xFF nor 0x00, it represents that the sector has valid data. In the flash memory, since the operation of programming a bit from 1 to 0 may be performed in unit of bytes, but the operation of programming a bit from 0 to 1 needs to be performed in unit of blocks, the exemplary embodiments use 0x00 to represent that the sector has been written with valid data ever but has currently been erased. In the exemplary embodiments, the data may be stored in sequence in an unwritten sector of the block. After the data is successfully stored, the sector that previously stores valid data is re-programmed as 0x00. The block is erased only when the block no longer has any sector with flag value of 0xFF. In comparisons with the conventional flash memory storage system in which the whole block has to be erased every time when data is updated when using a bootloader or configuring network setting, in the exemplary embodiments of the disclosure, the block may be erased after all the sectors in one block have been used. Accordingly, the disclosure may allow the life of the flash memory for the embedded system to be extended significantly.

It will be apparent to those skilled in the art that various modifications and variations can be made to the structure of the disclosed embodiments without departing from the scope or spirit of the disclosure. In view of the foregoing, it is intended that the disclosure cover modifications and variations of this specification provided they fall within the scope of the following claims and their equivalents.

What is claimed is:

1. A data storing method for writing an update data into a flash memory module to update an original data, wherein the flash memory module at lease comprises a block, the block comprises a plurality of sectors, each of the sectors comprises a plurality of bits, each of the bits is identified as a first storage status or a second storage status, and each of the sectors records a flag, the data storing method comprising:

getting a first sector among the sectors, wherein all bits of the flag of the first sector are the second storage status;

writing the update data into the first sector, programming at least one bit of the flag of the first sector as the first storage status and programming at least one bit of the flag of the first sector as the second storage status;

identifying a second sector storing the original data among the sectors, wherein at least one bit of the flag of the second sector is the first storage status and at least one other bit of the flag of the second sector is the second storage status; and programming all bits of the second sectors as the first storage status.

2. The data storing method according to claim 1, further comprising:

if the block does not have the flag with all the bits as the second storage status, programming all the bits of the block as the second storage status.

3. The data storing method according to claim 1, further comprising:

generating a corresponding error correction code for the update data stored in the first sector.

4. The data storing method according to claim 3, wherein, if all bits of the update data stored in the first sector are the first storage status, all bits of the corresponding error correction code are the first storage status.

5. The data storing method according to claim 1, further comprising:

determining sizes of the sectors according to sizes of the update data and the original data.

6. The data storing method according to claim 1, wherein the first storage status is 0 and the second storage status is 1.

7. An embedded system, comprising:

a flash memory module storing an original data, wherein the flash memory module at least comprises a block, the block comprises a plurality of sectors, each of the sectors comprises a plurality of bits, each of the bits is identified as a first storage status or a second storage status, and each of the sectors records a flag; and a controller coupled to the flash memory module, wherein the controller gets a first sector among the sectors, wherein all bits of the flag of the first sector are the second storage status;

wherein the controller writes an update data into the first sector and programs at least one bit of the flag of the first sector as the first storage status and programs at least one bit of the flag of the first sector as the second storage status;

wherein the controller identifies a second sector storing the original data among the sectors, wherein at least one bit of the flag of the second sector is the first storage status and at least one other bit of the flag of the second sector is the second storage status, wherein the controller programs all bits of the second sector as the first storage status.

8. The embedded system according to claim 7, wherein if the block does not have the flag with all the bits as the second storage status, the controller programs all the bits of the block as the second storage status.

9. The embedded system according to claim 7, wherein the controller further generates a corresponding error correction code for the update data stored in the first sector.

10. The embedded system according to claim 9, wherein if all bits of the update data stored in the first sector are the first storage status, all bits of the corresponding error correction code are the first storage status.

11. The embedded system according to claim 7, wherein the controller determines sizes of the sectors according to sizes of the update data and the original data.

12. The embedded system according to claim 7, wherein the first storage status is 0 and the second storage status is 1.

* * * * *